US012481329B2

(12) United States Patent
Jung

(10) Patent No.: US 12,481,329 B2
(45) Date of Patent: Nov. 25, 2025

(54) DISPLAY APPARATUS

(71) Applicant: LG Display Co., Ltd., Seoul (KR)

(72) Inventor: Jaeho Jung, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 205 days.

(21) Appl. No.: 18/387,352

(22) Filed: Nov. 6, 2023

(65) Prior Publication Data

US 2024/0160250 A1 May 16, 2024

(30) Foreign Application Priority Data

Nov. 10, 2022 (KR) ........................ 10-2022-0149833

(51) Int. Cl.
*G06F 1/16* (2006.01)
*H05K 1/18* (2006.01)

(52) U.S. Cl.
CPC ............. *G06F 1/1658* (2013.01); *H05K 1/18* (2013.01); *H05K 2201/10128* (2013.01)

(58) Field of Classification Search
CPC .................... G06F 1/1658; H05K 1/18; H05K 2201/10128; H10K 59/87
See application file for complete search history.

(56) References Cited

U.S. PATENT DOCUMENTS 8,118,472 B2 * 2/2012 Hsieh ................ G02F 1/133608 362/97.3
2007/0171215 A1 * 7/2007 Song ..................... G06F 1/1601 345/204
2007/0290985 A1 * 12/2007 Matsumoto ............. G02F 1/135 349/61
2008/0247146 A1 * 10/2008 Kerner .................. H05K 7/142 361/796
2011/0164394 A1 * 7/2011 Hwang ................. G06F 1/1601 361/679.01
2012/0327617 A1 * 12/2012 Maeyama ......... G02F 1/133308 361/752
2018/0338021 A1 * 11/2018 Hebert ................ H04M 1/0277
2021/0068315 A1 * 3/2021 Ha .......................... H05K 5/03

FOREIGN PATENT DOCUMENTS

KR 10-2020-0072852 A 6/2020

* cited by examiner

*Primary Examiner* — Allen L Parker
*Assistant Examiner* — Dakota M Talbert
(74) *Attorney, Agent, or Firm* — Birch, Stewart, Kolasch & Birch, LLP

(57) ABSTRACT

A display apparatus can include a display panel, a front cover member positioned on a front side of the display panel, a guide holder positioned on a rear side of the display panel and accommodating a source printed circuit board connected to the display panel, a control printed circuit board positioned on a board supporting block formed in the guide holder and connected to the source printed circuit board, a back cover member positioned on a rear side of the guide holder and enclosing the source printed circuit board and the control printed circuit board, and a holder member positioned on the guide holder and the back cover member and coupling the guide holder and the back cover member, thereby reducing the total number of components, streamlining the manufacturing process, mitigating component deformation, and reducing the thickness and bezel size.

14 Claims, 12 Drawing Sheets

DISPLAY APPARATUS

CROSS REFERENCE TO RELATED APPLICATION

The present application claims priority to Korean Patent Application No. 10-2022-0149833 filed in the Republic of Korea on Nov. 10, 2022, the entire contents of which are hereby expressly incorporated by reference into the present application.

BACKGROUND

Field

The present invention relates to a display apparatus, and more particularly, to a display apparatus capable of reducing the total number of components and processing steps, mitigating component deformation, and reducing thickness and bezel size.

Discussion of the Related Art

Recently, rapid advance of the field of displays for representing electrical information signals has led to developments of various display apparatuses with excellent performance in terms of compactness, lightweight, and low power consumption.

Liquid crystal display (LCD) apparatuses and organic light emitting display (OLED) apparatuses are represented examples of such display apparatuses.

Among them, self-luminous display apparatuses such as organic light emitting display apparatuses are being considered to be used in competitive applications for achieving compactness and vivid color display without requiring a separate light source. Such display apparatuses are equipped with self-light emitting components at each sub-pixel, where the light-emitting component includes two electrodes facing each other and a light emitting layer interposed between them, for emitting light when the transported electrons and holes recombine.

Display apparatuses can include a display panel and several other components to provide various functions. For example, one or more display-driving circuits for controlling the display panel can be included in the display assembly. Examples of driving circuits include gate drivers, light-emitting (source) drivers, power (VDD) routers, electrostatic discharge (ESD) circuits, multiplex (MUX) circuits, data signal lines, cathode contacts, and other functional elements.

The display assembly can also include multiple peripheral circuits to provide additional functions, such as touch sensing, fingerprint identification, etc. Some components can be placed on the display panel itself, while others can be placed on films or circuit boards disposed outside the display panel.

Organic light-emitting display apparatuses have the advantage of being able to be made into thin film devices using a light-emitting layer between electrodes. Additionally, since they do not require separate light sources, organic light-emitting display apparatuses are well-suited for being designed into various forms, such as flexible, bendable, and foldable display apparatuses.

Display apparatuses such as organic light-emitting display apparatuses, which include spontaneous light-emitting components, are expanding their scope of application to various fields, such as traditional electronic devices like televisions (TVs), as well as car instrument panels, windshields, mirror displays, indoor and outdoor signage, and more. Such display apparatuses would need optimization to suit their usage environment.

SUMMARY OF THE DISCLOSURE

The present invention has been conceived to solve or address the problems and limitations in the related technical field as described above, and it is an object of the present invention to provide a display apparatus capable of reducing the total number of components, shortening the manufacturing process, mitigating component deformation, and reducing thickness and bezel size.

In order to accomplish the above objects, a display apparatus according to an example of the present invention can include a display panel, a front cover member positioned on a front side of the display panel, a guide holder positioned on a rear side of the display panel and accommodating a source printed circuit board connected to the display panel, a control printed circuit board positioned on a board supporting block formed in the guide holder and connected to the source printed circuit board, a back cover member positioned on a rear side of the guide holder and enclosing the source printed circuit board and the control printed circuit board, and a holder member positioned on the guide holder and the back cover member and coupling the guide holder and the back cover member.

Also, in an embodiment of the present invention, the holder member can include a first snap-fit member arranged on the guide holder and a fixing member arranged on a bottom surface of the back cover member and coupled with the first snap-fit member.

Also, in an embodiment of the present invention, the first snap-fit member can include a first body arranged to protrude in the direction of the back cover member from the bottom surface of the guide holder and a first protrusion formed on the first body to protrude in a direction parallel to the guide holder.

Also, in an embodiment of the present invention, wherein the fixing member can include a fixing body arranged to protrude in the direction of the guide holder from the bottom surface of the back cover member and a snap-fit groove formed by penetrating the fixing body to accommodate the insertion of the first protrusion.

Also, in an embodiment of the present invention, the holder member can include a second snap-fit member including a second body arranged at an edge of the guide holder and protruding in the direction of the back cover member, and a second holder formed on the second body and protruding in the direction parallel to the guide holder, and a protrusion member arranged to protrude inward from a side of the back cover member and engage with the second protrusion.

Also, in an embodiment of the present invention, the holder member can further include a support beam arranged on a bottom surface of the back cover member and formed to protrude in a direction of the control printed circuit board, the support beam contacting the control printed circuit board to fix the control printed circuit board in response to the guide holder being coupling with the back cover member.

Also, in an embodiment of the present invention, the holder member can further include a conductive member arranged on the control printed circuit board to contact the support beam and transfer heat of the control printed circuit board to the back cover member.

Also, in an embodiment of the present invention, the holder member can include a first snap-fit member arranged on the guide holder and a detachment member arranged on a bottom surface of the back cover member to be engaged with the first snap-fit member.

Also, in an embodiment of the present invention, the first snap-fit member can include a first body arranged to protrude in direction of the back cover member from the bottom surface of the guide holder and a first protrusion formed on the first body to protrude in a direction parallel to the guide holder, and the detachment member can include a body beam arranged to protrude in a direction of the guide holder from the bottom surface of the back cover member and a detachment protrusion formed to protrude from the body beam to engage with the first protrusion.

Also, in an embodiment of the present invention, the holder member can further include an edge coupling portion to connect the edges of the guide holder and the back cover member.

Also, in an embodiment of the present invention, the edge coupling portion can include an edge protrusion portion arranged to protrude at an outer edge of the guide holder and an edge groove formed to be recessed into a side of the back cover member to accommodate the edge protrusion portion.

Also, in an embodiment of the present invention, the display apparatus can further include a side adhesive member arranged along the edges of the front cover member and the back cover member to adhere the front cover member and the back cover member together.

Also, in an embodiment of the present invention, can further include a black coating member positioned between the guide holder and the display panel.

According to the present invention, it is possible to integrate a heat sink plate, a guide holder, and a core plate that are traditionally manufactured using different materials through respective processes into a single component of an identical material, resulting in a reduction of the total number of components, manufacturing processes, and manufacturing cost.

Furthermore, by eliminating or minimizing the screw fastening method, it is possible to improve the issue of component deformation during the assembly process.

This allows for the reduction of the overall thickness of the display apparatus and bezel size.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
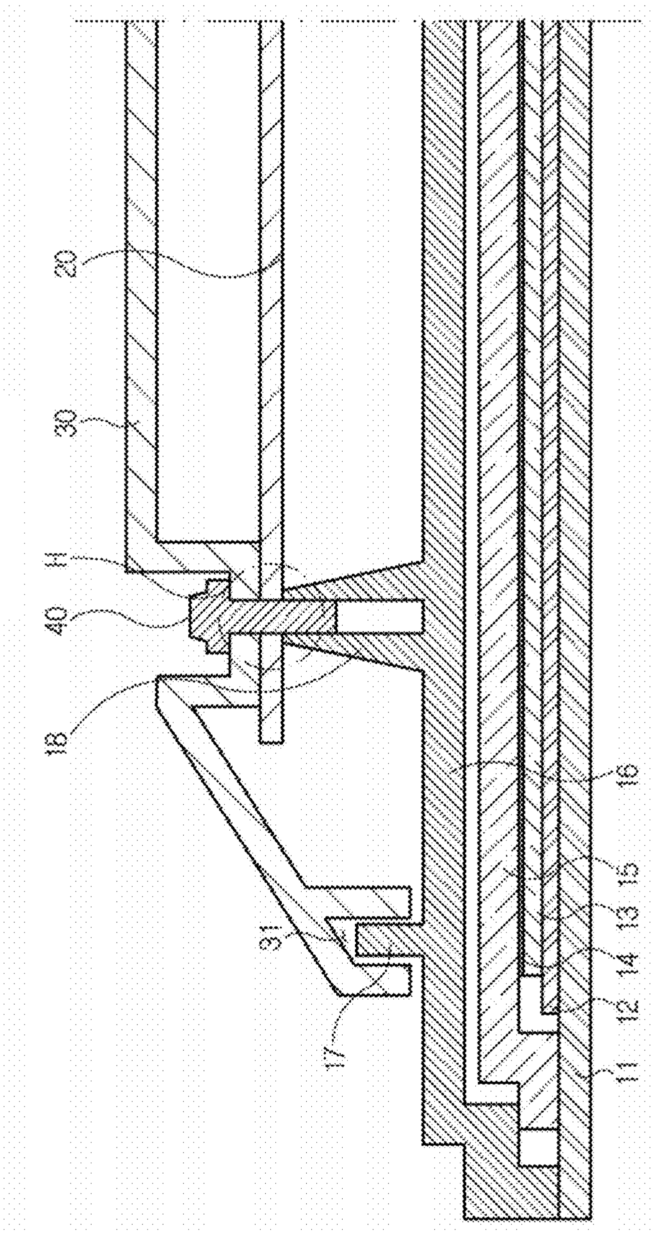
FIG. 1 is a schematic partial cross-sectional view illustrating the assembly structure of a display apparatus according to a comparative example.

Advantages and features of the present invention and methods of accomplishing the same can be understood more readily by reference to the following detailed description of embodiments and the accompanying drawings. The present invention may, however, be embodied in many different forms and should not be construed as being limited to the exemplary embodiments set forth herein; rather, these exemplary embodiments are provided so that the present invention will be thorough and complete and will fully convey the concept of the invention to those skilled in the art, and the present invention will only be defined by the appended claims.

The shapes, sizes, ratios, angles, numbers and the like illustrated in the drawings to describe embodiments of the present invention are merely exemplary, and thus, the present invention is not limited thereto. Throughout the specification, the same reference numerals refer to the same components. In addition, detailed descriptions of well-known technologies can be omitted in the present invention to avoid obscuring the subject matter of the present invention. When terms such as “comprises,” “has,” “includes,” or “is made up of” are used in this specification, it should be understood that unless “only” is specifically used, additional elements or steps can be included. Unless otherwise explicitly stated, when a component is expressed in the singular form, it is intended to encompass the plural form as well.

In interpreting the components, it is construed to include a margin of error even in the absence of explicit description.

When describing the positional relationship, for example, when the relationship between two parts is described as “on”, “on top of”, “underneath”, “beside”, etc., unless “directly” or “immediately” is used, one or more other parts can be located between the two parts.

When a device or layer is referred to as being “on” another device or layer, it includes cases where one device or layer is directly located on the other device or layer or still other device or layer is interposed between the two devices or layers.

Although the terms “first”, “second”, and the like are used to describe various components, these components are not limited by these terms. These terms are merely used for distinguishing one component from the other components, and may not define any order or sequence. Therefore, the first component mentioned hereinafter can be the second component in the technical sense of the present invention.

Throughout the specification, the same reference numerals refer to the same components.

The sizes and thicknesses of each component shown in the drawings are presented for the convenience of description and are not intended to limit the present invention.

The features of various embodiments of the present invention can be combined or assembled, either partially or entirely, in various technical manners such as interlocking and interoperations obvious to those skilled in the art, and each embodiment can be independently implemented or in conjunction with related embodiments. Further, the terms such as "invention" and "disclosure" can be interchangeably used herein.

Hereinafter, detailed descriptions are made of the embodiments of the present invention with reference to the accompanying drawings.

In this disclosure, the term "display apparatus" is used in a narrow sense to refer to display apparatuses, such as a liquid crystal module (LCM), an organic light-emitting diode (OLED) module, and a quantum dot (QD) module, each including a display panel and a panel driving unit to operate the display panel. It is also possible to include set electronic devices or set device or apparatuses such as equipment displays, including complete or final products such as laptop computers, televisions, computer monitors, automotive displays or equipment displays provided in other forms for vehicles, as well as mobile electronic devices such as smartphones or electronic pads that include LCMs, OLED modules, QD modules, and the like.

Accordingly, in this disclosure, the display apparatus can include not only the display apparatuses in the narrow sense themselves, such as LCMs, OLED modules, and QD modules, but also set devices as application products or final consumer devices each including LCMs, OLED modules, QD modules, and the like.

Additionally, in some cases, an LCM, an OLED module, or a QD module, composed of a display panel and a panel driving unit can be referred to as a "display apparatus" in a narrow sense, while an electronic device as a complete product including an LCM, an OLED module, or a QD module can be referred to as "set device". For example, the narrow-sense display apparatus can include a display panel of liquid crystal (LCD), organic light-emitting diode (OLED), or quantum dot (QD) and a source printed circuit board (PCB) as a control unit for driving the display panel, while a set device can further include a set PCB, serving as a set control unit that is electrically connected to the source PCB and controls the entire set device.

The display panel used in this disclosure can include all types of display panels such as liquid crystal display panels, organic light-emitting diode (OLED) display panels, quantum dot (QD) display panels, and electroluminescent display panels, and is not limited to a specific display panel capable of bending a bezel with a flexible substrate for an OLED display panel of this embodiment and a backplane support structure thereunder. In addition, the display panel used in the embodiments of this disclosure is not limited to the shape or size of the display panel.

For example, when the display panel is an organic light-emitting diode (OLED) display panel, it can include a plurality of gate lines and data lines and pixels formed at the intersection of the gate lines and data lines. In addition, it can be configured to include an array including thin-film transistors as components for selectively applying a voltage to each pixel, an organic light-emitting diode (OLED) layer on the array, an encapsulation substrate or encapsulation layer arranged on the array to cover the organic light-emitting diode layer, etc.

The encapsulation layer can protect the thin film transistors and the organic light-emitting device layer from the external impacts and prevent moisture or oxygen from penetrating the organic light-emitting device layer. In addition, the layers formed on the array can include an inorganic light-emitting layer, such as a nano-sized material layer or quantum dots, for example.

Accordingly, all components of each display apparatus according to all embodiments of the present disclosure are operatively coupled and configured.

FIG. 1 shows the assembly structure of a display apparatus according to a comparative example.

Referring to FIG. 1, the display apparatus according to the comparative example can include a cover glass 11, a display panel 12, a heat sink plate 13, an adhesive tape 14, a guide holder 15, a core plate 16, a control printed circuit board 20, and a back cover 30.

In the assembly structure, the cover glass 11 is positioned on the front side, and the display panel 12 is placed on the rear side of the cover glass 11. The heat sink plate 13 is positioned on the rear side of the display panel 12, made of aluminum material, and serves to dissipate the heat generated by the display panel 12. The heat sink plate 13 is fixed to the guide holder 15 made of polycarbonate (PC) material using adhesive tape 14. The core plate 16 is positioned on the rear side of the guide holder 15 and made of a material including magnesium (Mg), and a source printed circuit board, although not shown in the drawing, connected to the display panel 12 is positioned on the rear side of the core plate 16. In addition, the control printed circuit board 20 is positioned in connection to the source printed circuit board.

According to the comparative example, the assembly process involves laminating the heat sink plate 13 onto the rear side of the display panel 12, and then positioning the guide holder 15 and core plate 16 as described above.

The assembly process in the comparative example involves individually assembling these components, namely the heat sink plate 13, guide holder 15, and core plate 16, which are made of different materials, which entails the abundance of components and the need of distinct assembly steps, leading to an increase of manufacturing costs.

Next, the back cover 30 is positioned by fastening screws 40 to the fastening portion 18 formed on the core plate 16. In order to align the attachment position of the back cover 30, a protrusion 17 is inserted into a back cover groove 31.

However, such a screw fastening method poses a risk as excessive tightening of the screws 40 during the fastening process can lead to component deformation, potentially resulting in malfunction. For example, in section H shown in FIG. 1, where the screw 40 is used to fasten the back cover 30, core plate 16, and control printed circuit board 20, excessive tightening of the screws can cause deformation in the back cover 30, core plate 16, or control printed circuit board 20, potentially causing malfunctioning of the display apparatus.

Figure 2:
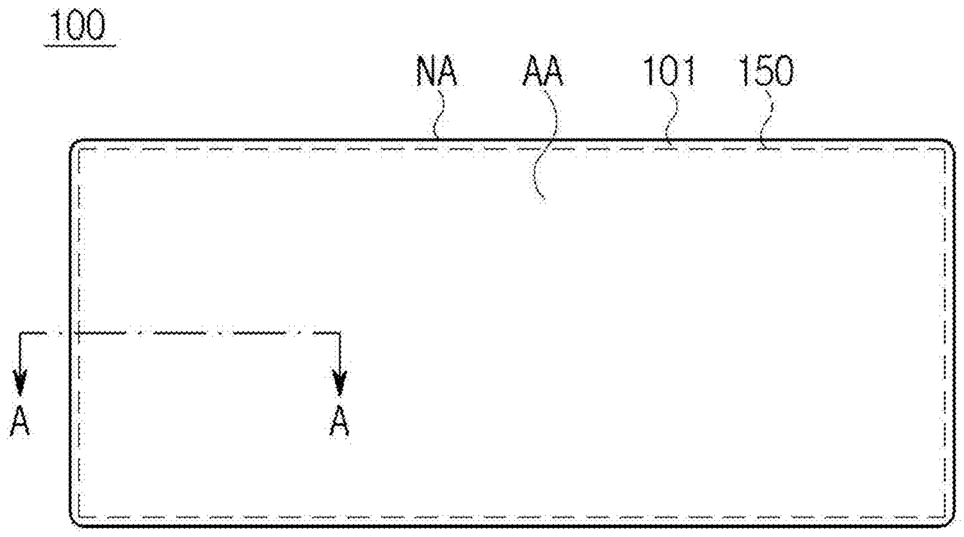
FIG. 2 is a view illustrating the front surface of a display apparatus according to an embodiment of this disclosure.

In contrast, in the present disclosure, FIG. 2 illustrates an exemplary organic light emitting diode (OLED) display panel that can be integrated within display apparatuses. Particularly, FIG. 2 is a diagram illustrating a display apparatus 100 according to an embodiment of this disclosure.

With reference to FIG. 2, the display apparatus 100 can be applied to various applications such as televisions (TVs), monitors, personal computers (PCs), and center consoles in vehicles. Although FIG. 2 shows a rectangular display panel 150, the shape of the display apparatus 100 is not necessarily limited thereto and can be produced in various shapes such as squares, polygons, or curves.

With reference to FIG. 2, in the case where the display apparatus 100 is equipped with both display and touch functionality, an additional front cover component 101 can be attached to the front, integrating the touch functionality. A display panel 150 for displaying can be positioned on the rear side of the cover member 101. The display apparatus 100 can be inserted and coupled to the dashboard of a vehicle. The display panel 150 can be made on a substrate of a rigid material, but in the case of organic light-emitting devices, it can also be made on a flexible substrate. A display panel 150 made on a flexible substrate can be deformed concavely or convexly depending on the shape of the dashboard, allowing for flexible design. The front cover member 101 can be a cover glass.

Figure 3:
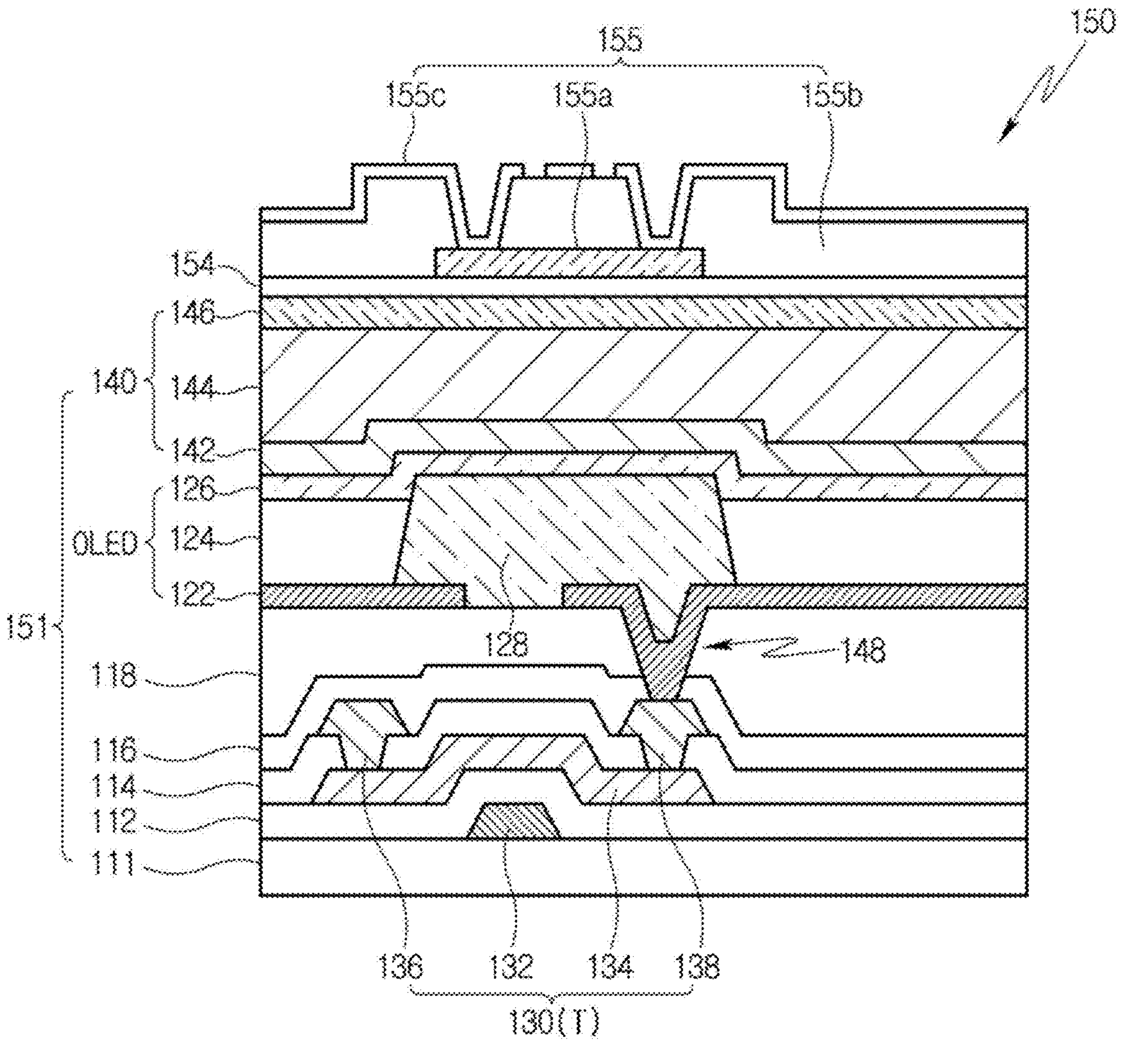
FIG. 3 is a cross-sectional view of a light-emitting component according to an embodiment of this disclosure.

FIG. 3 shows the cross-sectional structure of the light-emitting component provided in the display panel of FIG. 2.

With reference to FIG. 3, the substrate 111 can support various components of the display panel 150. The substrate 111 can be formed of a transparent dielectric material such as glass, plastic, and the like. In the case of being made of plastic, the substrate 111 can be a plastic film or a plastic substrate. For example, the substrate 111 can take the form of a film including one of the polyimide-based polymers, polyester-based polymers, silicone-based polymers, acrylic-based polymers, polyolefin-based polymers, and their copolymers. Among these materials, polyimide is mainly used as a plastic substrate because it is suitable for high-temperature processes and is a material that can be coated.

A buffer layer can be positioned on the substrate 111. The buffer layer is a functional layer that protects the thin film transistor (TFT) from impurities such as alkali ions that can leak from the bottom of the substrate 111. The buffer layer can be formed of silicon oxide (SiOx), silicon nitride (SiNx), or multiple layers thereof.

A thin film transistor 130 can be disposed on the buffer layer. The thin film transistor 130 can be formed by sequentially arranging a gate electrode 132, a gate insulating layer 112, a semiconductor layer 134, an interlayer insulating film 114, and source and drain electrodes 136 and 138 on the buffer layer. There can be one or more thin film transistors 130 arranged for a plurality of sub-pixels provided in the active area.

Although illustrated as the bottom-gate type in FIG. 3, the thin film transistor 130 is not limited thereto and can also be provided as the top-gate type, in which the order of the semiconductor layer 134 and the gate electrode 132 are reversed.

The semiconductor layer 134 can be arranged at a specific portion on the substrate 111 or the buffer layer. The semiconductor layer 134 can be made of polycrystalline silicon (p-Si), and in this case, a region of the semiconductor layer 134 can be doped with impurities to form the electrode layer. The semiconductor layer 134 can also be made of amorphous silicon (a-Si) and various organic semiconductor materials such as pentacene. Furthermore, the semiconductor layer 134 can also be made of an oxide material. The gate insulating layer 112 can be formed of inorganic dielectric materials such as silicon oxide (SiOx) or silicon nitride (SiNx) and organic dielectric materials. The gate electrode 132 can be formed of various conductive materials, such as magnesium (Mg), aluminum (Al), nickel (Ni), chromium (Cr), molybdenum (Mo), tungsten (W), gold (Au), or alloys thereof.

The first interlayer insulating film 114 can be formed of inorganic dielectric materials such as silicon oxide (SiOx) or silicon nitride (SiNx) and organic dielectric materials. The first interlayer insulating film 114 can be selectively removed to form contact holes exposing the source and drain regions.

The source and drain electrodes 136 and 138 are formed as a single layer or multilayer electrode material on the first interlayer insulating film 114.

An inorganic protective film 116 and a planarization layer 118 can be positioned on the thin film transistor 130 to cover the source and drain electrodes 136 and 138. The inorganic protective film 116 and the planarization layer 118 protect the thin film transistor 130 and flatten its upper surface.

The inorganic protective film 116 can be formed of inorganic dielectric films such as silicon nitride (SiNx) and silicon oxide (SiOx), while the planarization layer 118 can be made of organic dielectric films such as Benzocyclobutene (BCB) or acrylic (Acryl). The inorganic protective film 116 and the planarization layer 118 can each be formed as a single layer, dual-layer, or multilayer structure, and in some cases, one of the two layers can be omitted.

A light-emitting component OLED connected to the thin film transistor (TFT) 130 can be formed by sequentially arranging a first electrode 122, an organic light-emitting layer 124, and a second electrode 126. That is, the light-emitting component OLED can be composed of the first electrode 122 connected to the drain electrode 138 through the via hole 148 formed in the planarization layer 118 and the inorganic protective film 116, the organic light emitting layer 124 position on the first electrode 122, and the second electrode 126 positioned on the organic light-emitting layer 124.

When the display panel 150 is of a top emission type where the emission occurs upward through the second electrode 126, the first electrode 122 can include an opaque conductive material with high reflectivity. In this case, examples of reflective conductive material can include silver (Ag), aluminum (Al), gold (Au), molybdenum (Mo), tungsten (W), chromium (Cr), or alloys thereof.

A bank 128 is formed in the area excluding the light-emitting area, opening up the light-emitting area. Accordingly, the bank 128 has a bank hole exposing the first electrode 122 corresponding to the light-emitting area. The bank 128 can be made of inorganic dielectric materials such as silicon nitride (SiNx), silicon oxide (SiOx), or organic dielectric materials such as BCB, acrylic-based resins, or imide-based resins.

The organic light-emitting layer 124 is positioned on the first electrode 122 exposed by the bank 128. The organic light-emitting layer 124 can include a hole injection layer, a hole transport layer, an emissive layer, an electron transport layer, and an electron injection layer. In addition, the organic light-emitting layer 124 can be composed of a single emissive layer structure that emits a single light within a single stack, or a multi-stack structure including multiple stacks, each of which includes a single emissive layer of the same color. In such cases, adjacent sub-pixels can be arranged to emit different colors of light to display various colors. For example, sub-pixels with emissive layers of red, green, and blue can be arranged in a row or spaced apart from each other and, as well, in a triangle shape or pentile structure with some sub-pixels of predetermined colors aligned parallel and others aligned diagonally to each other.

In some cases, sub-pixels of white color can also be added to the arrangement. In addition, the organic light-emitting layer 124 can be configured by stacking a plurality of stacks including emissive layers emitting different colors of light to express white. In the case of expressing white with a stacked structure, separate color filters can be additionally added to each sub-pixel.

The second electrode 126 is positioned on the organic light-emitting layer 124. When the display panel 150 adopts a top emission structure, the second electrode 126 can be formed of a transparent conductive material such as Indium Tin Oxide (ITO) or Indium Zinc Oxide (IZO) or a semi-transparent metal or metal alloy such as MgAg to emit light generated in the organic light-emitting layer 124 upward through the second electrode 126.

The second electrode 126 can be arranged to reach a capping layer of the top. The capping layer can protect the OLED and assist in the extraction of light emitted through the second electrode 126 by using a material with a high refractive index.

An encapsulation layer 140 can be disposed on the light-emitting component OLED. The encapsulation layer 140 prevents the infiltration of oxygen and moisture from the outside to prevent oxidation of the emissive and electrode materials. Exposure of OLED to moisture or oxygen can cause pixel shrinkage or the formation of dark spots, reducing the emitting area. The encapsulation layer 140 is formed by alternately stacking inorganic layers 142 and 146 made of glass, metal, aluminum oxide (AlOx), or silicon (Si) materials and an organic layer 144 that serves as a buffer relieving the stress between layers due to the bending of the display panel (100 in FIG. 1) and enhances the flattening performance. The organic layer 144 can be made of organic dielectric materials such as acrylic resin, epoxy resin, polyimide, polyethylene, or silicon oxycarbide (SiOC). Here, the first and second inorganic layers 142 and 146 serve to block the penetration of moisture or oxygen, while the organic layer 144 flattens the surface of the first inorganic layer 142. The encapsulation layer 140 is composed of several thin film layers to increase the length and complexity of the path that moisture and oxygen must travel compared to a single layer, with the purpose of making it difficult for moisture and oxygen to penetrate the light-emitting component OLED.

A protective layer can be formed further between the light-emitting component OLED and the encapsulation layer 140 to protect the encapsulation layer 140 from being peeled off or affecting the uniformity during the manufacturing process of the encapsulation layer 140.

With reference to FIG. 3, a polarization layer 154 can be disposed on the encapsulation layer 140. The polarization layer 154 can minimize the impact of light entering the display panel 150 from external light sources on the semiconductor layer 134 or the organic light-emitting layer 124.

With reference to FIG. 3, a touch sensor layer 155 can be arranged on the polarization layer 154. The touch sensor layer 155 can be structured with the first touch electrode 155*a* and the second touch electrode 155*c* intersecting each other, allowing one electrode to receive an applied voltage signal and the other to sense the voltage signal. The first touch electrode 155*a* and the second touch electrode 155*c* can be patterned into polygonal or circular shapes on a touch insulation layer 155*b* to be arranged at a distance from each other.

The front cover member 101 can be disposed on the touch sensor layer 155. The touch sensor layer 155 and the front cover member 101 can be bonded together via an adhesive layer interposed therebetween.

Figure 4:
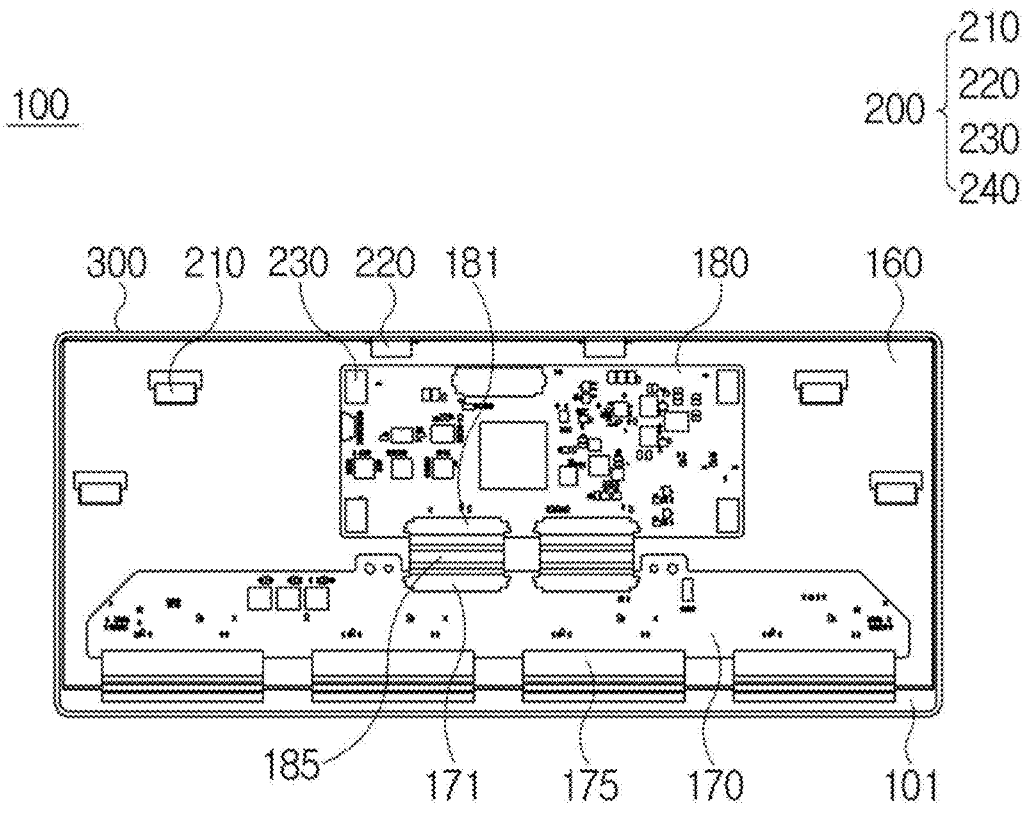
FIG. 4 is a plan view illustrating the back of a display apparatus according to an embodiment of this disclosure, with the back cover member removed.
Figure 5:
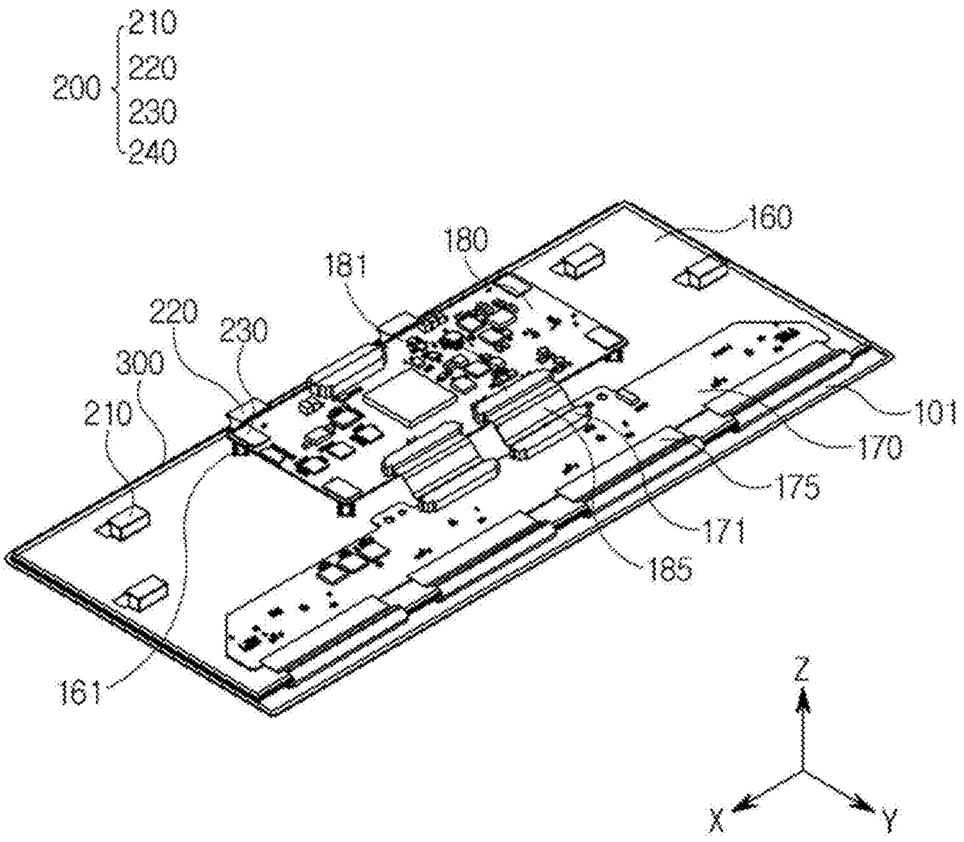
FIG. 5 is a perspective view illustrating the back of a display apparatus according to an embodiment of this disclosure, with the back cover member removed.
Figure 6:
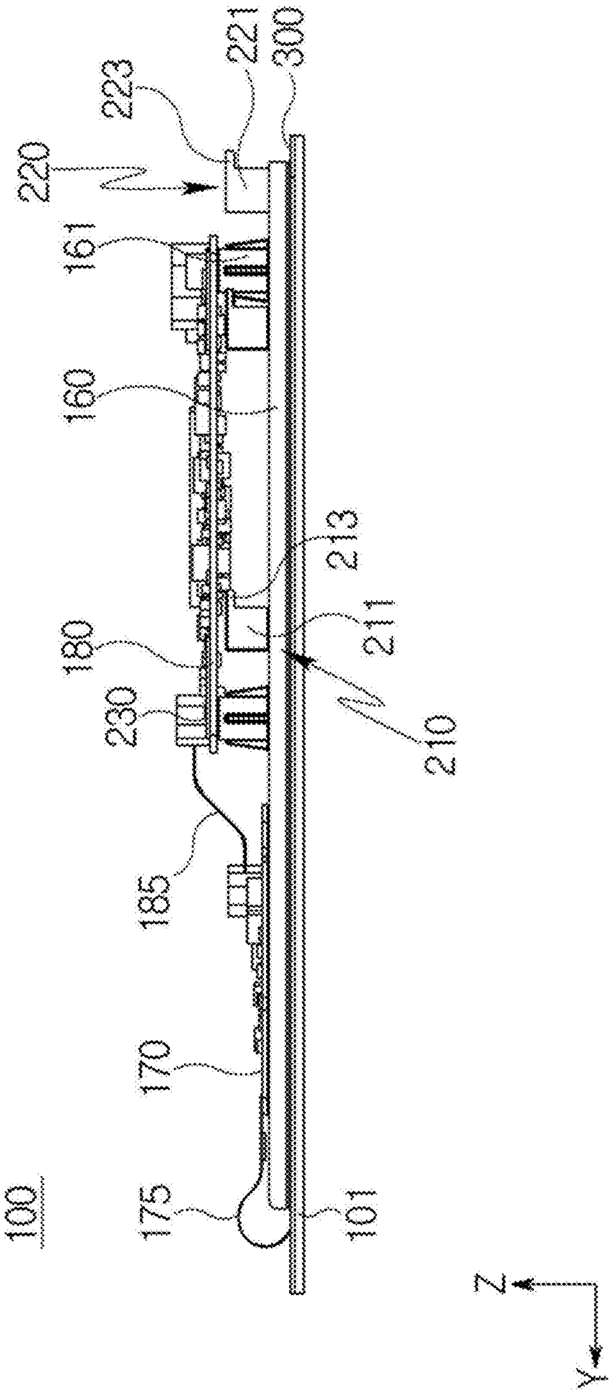
FIG. 6 is a side view illustrating a side of a display apparatus according to an embodiment of this disclosure, with the back cover member removed.
Figure 7:
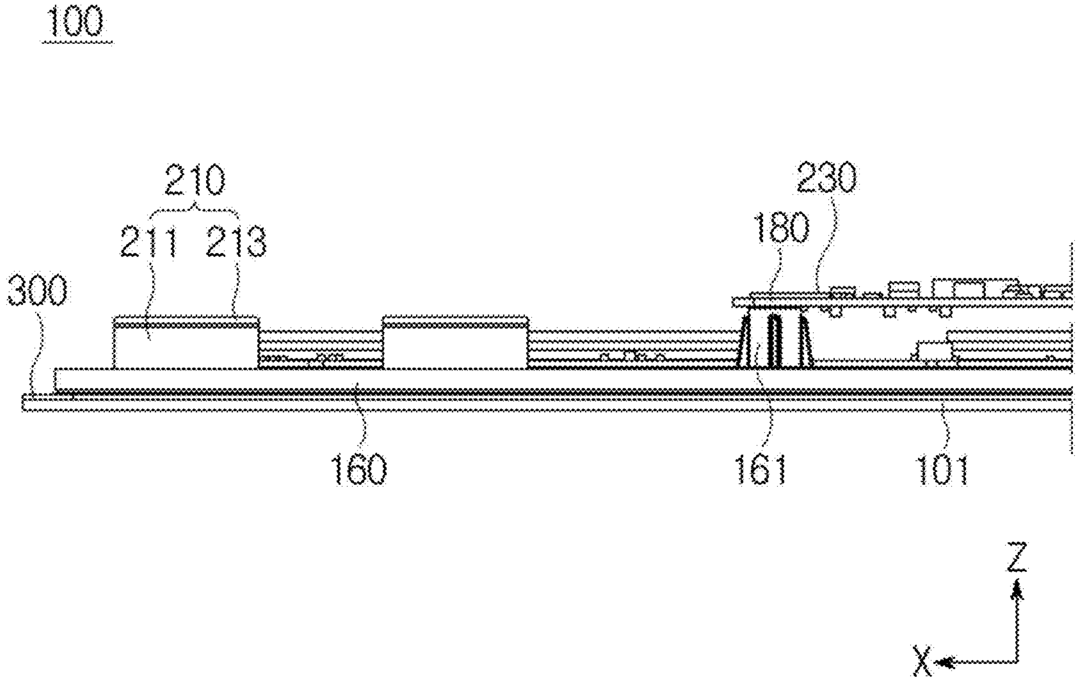
FIG. 7 is a partial side view of a side illustrating a display apparatus according to an embodiment of this disclosure, with the back cover member removed.
Figure 8:
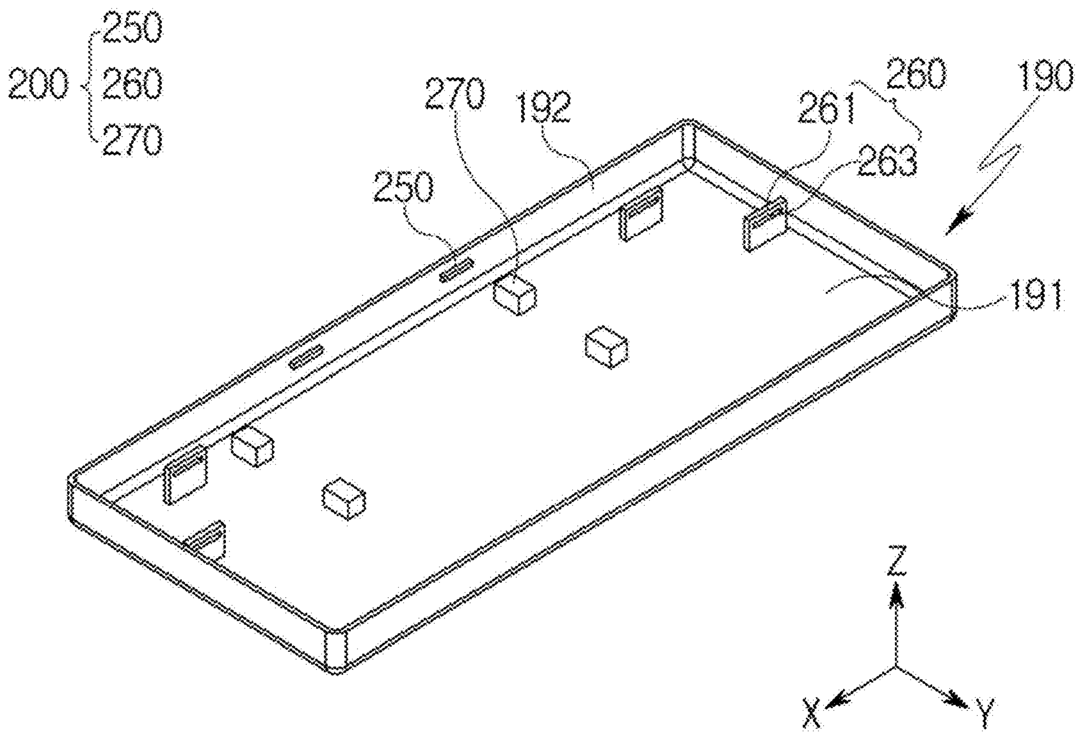
FIG. 8 is a perspective view illustrating a back cover member of a display apparatus according to an embodiment of this disclosure.
Figure 9:
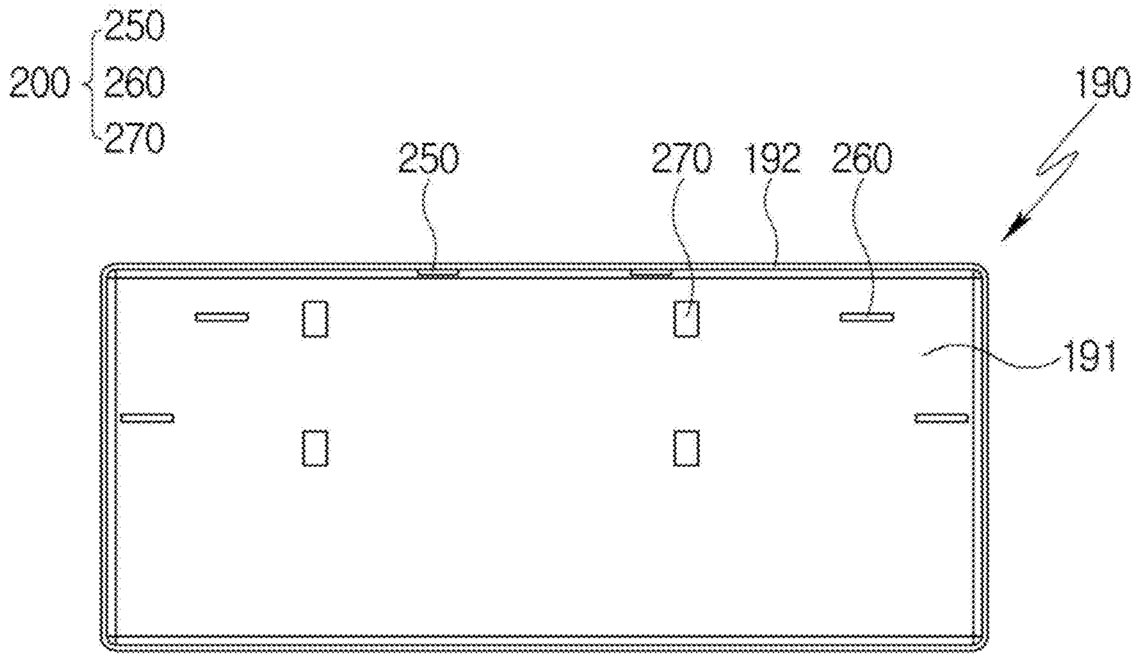
FIG. 9 is a plan view illustrating a back cover member of a display apparatus according to an embodiment of this disclosure.
Figure 10:
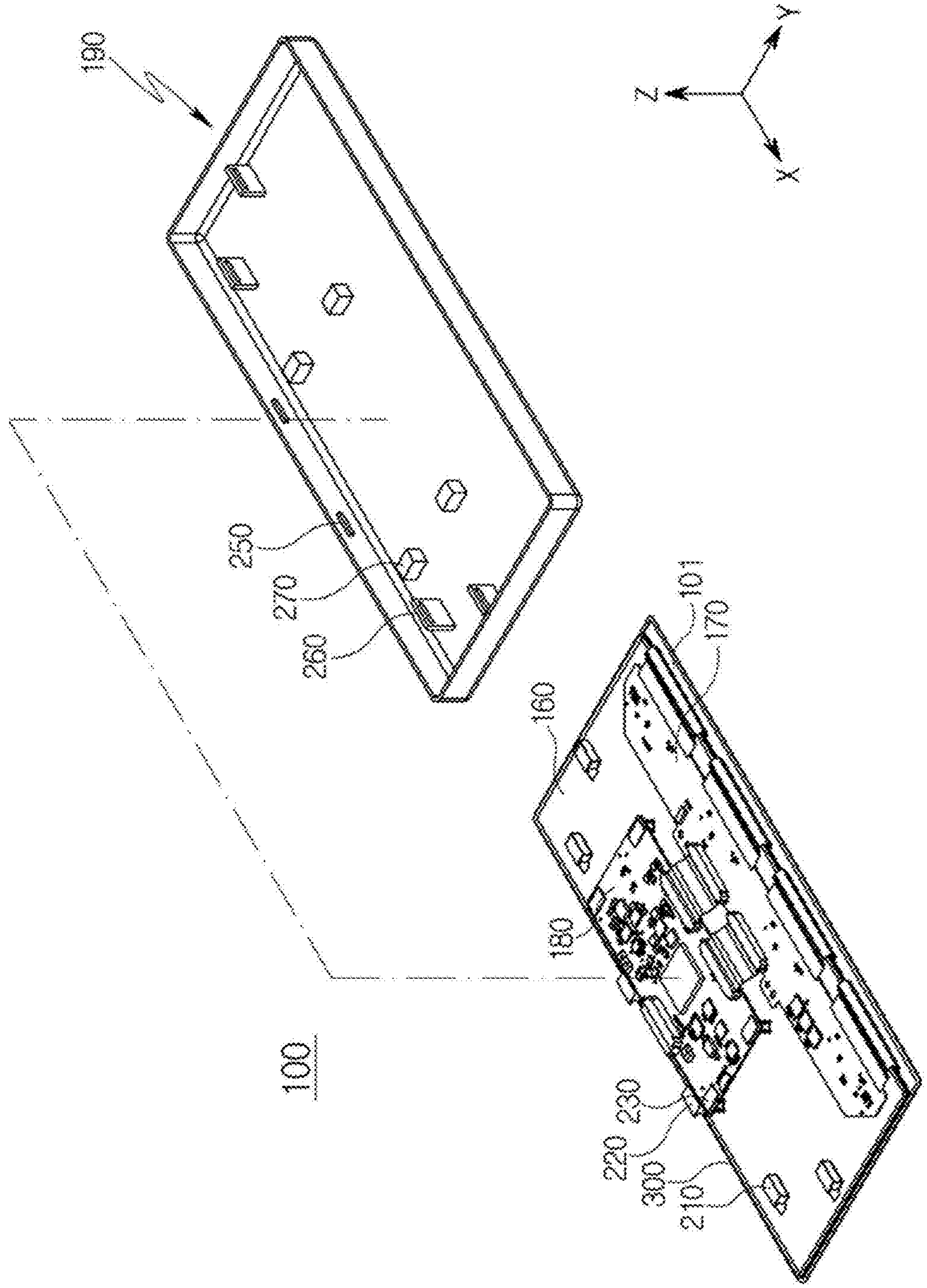
FIG. 10 is an exploded perspective view illustrating a holder member of a display apparatus according to an embodiment of this disclosure.
Figure 11:
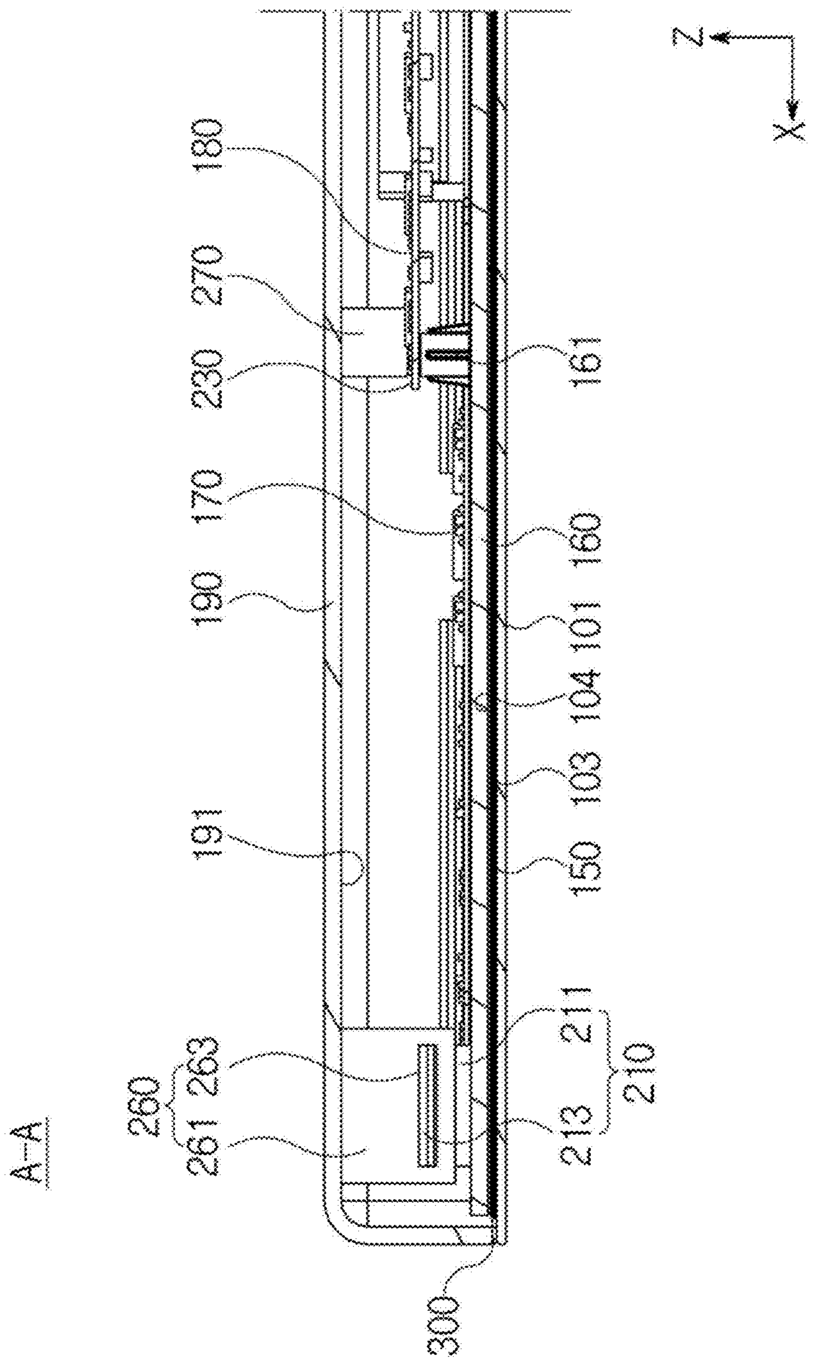
FIG. 11 is a cross-sectional view taken along the line A-A of FIG. 2.

FIG. 4 is a plan view illustrating the back of a display apparatus according to an embodiment of this disclosure, with the back cover member removed; FIG. 5 is a perspective view illustrating the back of a display apparatus according to an embodiment of this disclosure, with the back cover member removed; FIG. 6 is a side view illustrating a side of a display apparatus according to an embodiment of this disclosure, with the back cover member removed; FIG. 7 is a partial side view of a side illustrating a display apparatus according to an embodiment of this disclosure, with the back cover member removed; FIG. 8 is a perspective view illustrating a back cover member of a display apparatus according to an embodiment of this disclosure; FIG. 9 is a plan view illustrating a back cover member of a display apparatus according to an embodiment of this disclosure; FIG. 10 is an exploded perspective view illustrating a holder member of a display apparatus according to an embodiment of this disclosure; and FIG. 11 is a cross-sectional view taken along the line A-A of FIG. 2.

With reference to FIGS. 4 to 11, the display apparatus 100 according to an embodiment of this disclosure can include a front cover member 101, a display panel 150, a guide holder 160, a source printed circuit board 170, a control printed circuit board 180, a back cover member 190, a black coating member 104, a holder member 200, and a side adhesive member 300.

The front cover member 101 can be positioned on the front of the display panel 150 and can be made of a high-strength glass material, but it is not limited thereto. The front cover member 101 can include an active area (AA in FIG. 1) and an inactive area (NA in FIG. 1). The active area AA can correspond to the location of the display panel 150, while the non-active area NA can correspond to the bezel area.

The display panel 150 can be positioned on the rear side of the front cover member. The display panel 150 according to an embodiment of this disclosure is structured as described above.

The guide holder 160 can be positioned on the rear side of the display panel 150. the guide holder 160 can be made of a high thermal conductivity material such as aluminum, but is not limited thereto. For example, it can be made of a synthetic metal material that includes magnesium.

Here, the guide holder 160 can be adhered to the rear side of the display panel 150 using a separate bonding device, while the adhesive tape (103 in FIG. 11) is positioned. Accordingly, the guide holder 160 can serve as a heat sink to dissipate the heat generated by the display panel 150.

The black coating member (104 in FIGS. 11 and 12) can be positioned on the surface of the guide holder facing the display panel 150 between the guide holder 160 and the adhesive tape 103.

The black coating member 104 can be applied on the surface of the guide holder 160 facing the display panel 150 to prevent potential defects or degradation of the display quality, which can occur when directly attaching parts of the guide holder 160 to the display panel 150, and improve heat dissipation effects.

In an embodiment of this disclosure, the guide holder 160 is designed to perform the function of dissipating heat generated from the display panel 150 while also securely holding the source printed circuit board 170 and the control printed circuit board 180.

In the case where the holder member 200 is integrally formed with the guide holder 160 as to be discussed below, the guide holder 160 can also perform the function of coupling with the back cover member 190.

The source printed circuit board 170 can be positioned on the rear side of the guide holder 160 and connected to the display panel 150 via the first flexible circuit board 175.

The control printed circuit board 180 can be positioned on the board support block 161 formed on the guide holder 160 and connected to the source printed circuit board 170 via the second flexible circuit board 185. In detail, the second flexible circuit board 185 connects the first connector 171 positioned on the source printed circuit board 170 and the second connector 181 positioned on the control printed circuit board 180 for the control printed circuit board 180 to control the source printed circuit board 170.

Here, the first and second flexible circuit boards 175 and 185 can be a flexible circuit, a chip on film (COF), or the like.

Here, the board support block 161 can be arranged in multiple quantities, and the control printed circuit board 180 can be seated on the plurality of the board support blocks 161 on the rear side of the guide holder 160.

The back cover member 190 can be positioned on and coupled to the rear side of the guide holder 160 and enclose and protect the source printed circuit board 170 and the control printed circuit board 180. The back cover member 190 can be made of a synthetic metal material including magnesium (Mg) or polycarbonate (PC) material, but is not necessarily limited thereto.

Meanwhile, the holder member 200 can be positioned between the guide holder 160 and the back cover member 190 to couple the guide holder 160 and the back cover member 190 together. In an embodiment of this disclosure, the holder member 200 can be integrally formed with the guide holder 160, but is not necessarily limited thereto.

By eliminating or minimizing the traditional screw fastenings and incorporating a snap-fit structure, the holder member 200 can ensure the coupling force between the guide holder 160 and the back cover member 190 while preventing component deformation issues during the fastening process.

In an embodiment of this disclosure, the holder member 200 can include a first snap-fit member 210, a second snap-fit member 220, a fixing unit 260, a protrusion member 250, a support beam 270, and a conductive member 230.

The first snap-fit member 210 can be positioned on the guide holder 160 and include a first body 211 and a first protrusion 213.

The first body 211 can be positioned in the direction from the guide holder 160 to the back cover member 190, e.g., in the Z-axis direction. In an embodiment of this disclosure, the first body 211 can have a rectangular block shape, but is not necessarily limited thereto.

The first protrusion 213 can be formed on the first body 211 to protrude in the direction parallel to the guide holder 160, e.g., in the Y-axis direction.

The fixing unit 260 can be positioned on the bottom surface 191 of the back cover member 190 to be coupled to the first snap-fit member 210. The fixing unit 260 can include a fixing body 261 and a snap-fit groove 263.

The fixing body 261 can be positioned on the bottom surface 191 of the back cover member 190, protruding in the direction from the back cover member 190 to the guide holder 160, e.g., in the Z-axis direction. In an embodiment of this disclosure, the fixing body 261 can have a rectangular block shape, but is not necessarily limited thereto.

The snap-fit groove 263 can be formed by penetrating through the fixing body 261. When the back cover member 190 is coupled to the guide holder 160, the first protrusion 213 is inserted into the snap-fit groove 263.

The second snap-fit member 220 can be positioned at the edge of the guide holder 160 and include a second body 221 and a second protrusion 223.

The second body 221 can be positioned in the direction of the back cover member 190, e.g., in the Z-axis direction. In an embodiment of this disclosure, the second body 221 can have a rectangular block shape, but is not necessarily limited thereto.

The second protrusion 223 can be formed on the second body 221 to protrude in the direction parallel to the guide holder 160, e.g., in the Y-axis direction.

The protrusion member 250 can be positioned on the side 192 of the back cover member 190, protruding inward, e.g., in the Y-axis direction. In this case, the protrusion member 250 and the second protrusion 223 can protrude in directions facing each other. Accordingly, when the back cover member 190 is coupled to the guide holder 160, the protrusion member 250 comes into contact with the second protrusion 223 and becomes secured.

With reference to FIGS. 4 and 5, the first snap-fit member 210 is positioned in multiple quantities on the rear side of the guide holder 160, and the second snap-fit members 220 is arranged in multiple quantities along the edge of the guide holder 160, adjacent to the control printed circuit board 180.

With reference to FIGS. 8 and 9, the fixing unit 260 is positioned in multiple quantities on the bottom surface 191 of the back cover member 190, and the protrusion member 250 is arranged in multiple quantities on the side 192 of the back cover member 190.

When the back cover member 190 is coupled to the guide holder 160, the plurality of first protrusions 213 are inserted into the plurality of snap-fit grooves 263, and the plurality of protrusion members 250 come into contact with the second protrusions 223, allowing for secure coupling between the back cover member 190 and the guide holder 160.

Meanwhile, the support beam 270 can be positioned on the bottom surface 191 of the back cover member 190 and formed to protrude in the direction of the control printed circuit board 180, e.g., in the Z-axis direction. In an embodiment of this disclosure, the support beam 270 can have a rectangular block shape, but is not necessarily limited thereto.

As described above, the control printed circuit board 180 is positioned on top of the board support block 161, and thus, when the back cover member 190 is coupled to the guide holder 160, the support beam 270 comes into contact with the control printed circuit board 180, allowing for the fixation of the control printed circuit board 180 in the Z-axis direction.

The conductive member 230 can be positioned on the control printed circuit board 180 and come into contact with the support beam 270. In an embodiment of this disclosure, the conductive member 230 can take the form of a conductive adhesive tape 103, but is not necessarily limited thereto.

When taking the form of a conductive adhesive tape 103, the conductive member 230 can serve to indirectly secure the back cover member 190 and the guide holder 160 by adhering the conductive member 230 to both the support beam 270 and the control printed circuit board 180. Furthermore, the conductive member 230 can also serve to connect the back cover member 190 and the control printed circuit board 180, facilitating the transfer of heat generated from the control printed circuit board 180 to the back cover member 190 for heat dissipation.

Meanwhile, the side adhesive member 300 can be positioned along the edges of the front cover member 101 and the back cover member 190, to adhere the front cover member 101 and the back cover member 190 together.

Since the back cover member 190 is in the state of being coupled to the guide holder 160 by the holder member 200 and the guide holder 160 is in the state of being coupled to the display panel 150 and the front cover member 101 by the adhesive tape 103, the front cover member 101 and the back cover member 190 are effectively joined together.

In this case, the side adhesive member 300 is positioned along the perimeter of the front cover member 101 and the back cover member 190 to ensure that the edges of the front cover member 101 and the back cover member 190 are joined together, achieving a more stable coupling state.

By positioning the side adhesive member 300 along the perimeter of the front cover member 101 and the back cover member 190, the ingress of external particles into the interior of the display apparatus 100 can be prevented.

Figure 12:
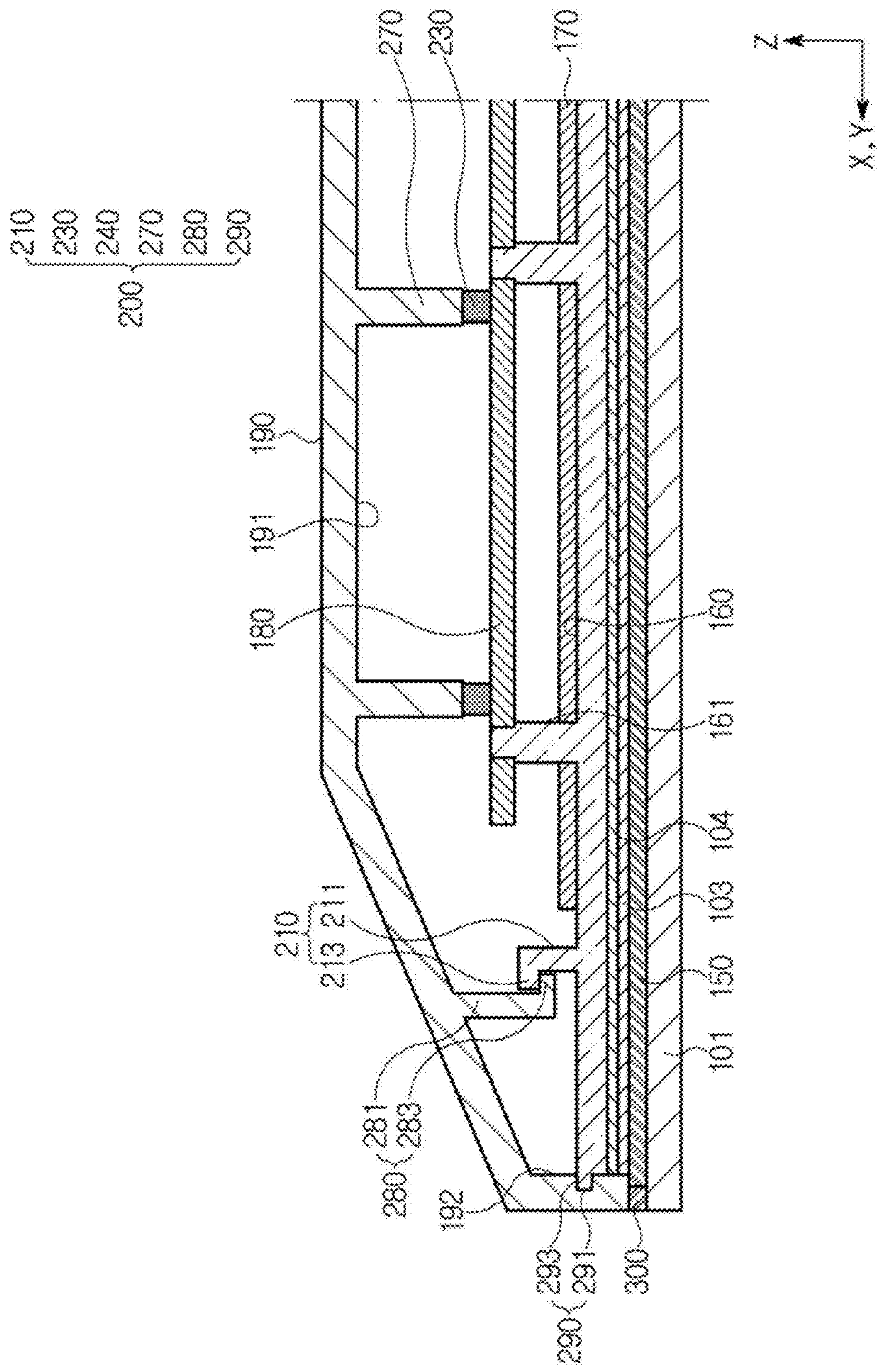
FIG. 12 is a cross-sectional view illustrating a display apparatus according to another embodiment of this disclosure.

Meanwhile, FIG. 12 shows the display apparatus 100 according to another embodiment of this disclosure.

With reference to FIG. 12, the display apparatus 100 according to an embodiment of this disclosure can include a front cover member 101, a display panel 150, a guide holder 160, a source printed circuit board 170, a control printed circuit board 180, a back cover member 190, a black coating member 104, a holder member 300, and a holder member 200.

Hereinafter, the description will focus on the holder member while omitting the detailed descriptions of the front cover member 101, display panel 150, guide holder 160, source printed circuit board 170, control printed circuit board 180, back cover member 190, black coating part 104, and side adhesive member 300, which are identical to those in the previous embodiment of the present disclosure.

In another embodiment of this disclosure, the holder member 200 can include a first snap-fit member 210, a detachment portion 280, a support beam 270, a conductive member 230, and an edge coupling portion 290.

The first snap-fit member 210 can be positioned on the guide holder 160 and include a first body 211 and a first protrusion 213.

The first body 211 can be positioned in the direction from the guide holder 160 to the back cover member 190, e.g., in the Z-axis direction. In an embodiment of this disclosure, the first body 211 can have a rectangular block shape, but is not necessarily limited thereto.

The first protrusion 213 can be formed on the first body 211 to protrude in the direction parallel to the guide holder 160, e.g., in the X-axis or Y-axis direction.

The detachment portion 280 can be positioned on the bottom surface 191 of the back cover member 190 and coupled to the first snap-fit member 210. The detachment portion 280 can include a body beam 281 and a detachment protrusion 283.

The body beam 281 can be positioned on the bottom surface 191 of the back cover member 190 and protrude in the direction of the guide holder 160, e.g., in the Z-axis direction. In an embodiment of the present disclosure, the body beam 281 can take the form of a square block shape, but is not necessarily limited thereto.

The detachment protrusion 283 can be formed to protrude from the body beam 281 to be engaged with the first protrusion 213 when the back cover member 190 is coupled to the guide holder 160.

The support beam 270 can be positioned on the bottom surface 191 of the back cover member 190 and formed to protrude in the direction of the control printed circuit board 180, e.g., in the Z-axis direction. In an embodiment of this disclosure, the support beam 270 can have a rectangular block shape, but is not necessarily limited thereto.

As described above, the control printed circuit board 180 is positioned on top of the substrate support block 161, and thus, when the back cover member 190 is coupled to the guide holder 160, the support beam 270 comes into contact with the control printed circuit board 180, allowing for the fixation of the control printed circuit board 180 in the Z-axis direction.

The conductive member 230 can be positioned on the control printed circuit board 180 and come into contact with the support beam 270. In an embodiment of this disclosure, the conductive member 230 can take the form of a conductive adhesive tape 103, but is not necessarily limited thereto.

When taking the form of a conductive adhesive tape 103, the conductive member 230 can serve to indirectly secure the back cover member 190 and the guide holder 160 by adhering the conductive member 230 to both the support beam 270 and the control printed circuit board 180. Furthermore, the conductive member 230 can connect the non-conductive back cover member 190 and the control printed circuit board 180 and also serve as a ground connection.

The edge coupling portion 290 can connect the edges of the guide holder 160 and the back cover member 190. The edge coupling portion 290 can include an edge protrusion portion 293 and an edge groove 291.

The edge protrusion portion 293 can be formed to protrude from the outer edge of the guide holder 160. Furthermore, the edge protrusion portion 293 can be arranged in multiple quantities at regular intervals along the outer edge of the guide holder 160.

The edge groove 291 can be formed to be recessed into the side 192 of the back cover member 190 to accommodate the edge protrusion portion 293. The edge groove 291 can be formed in quantity corresponding to the number of edge protrusion portions 293.

Through the above structure, the display apparatus 100 according to an embodiment of the present disclosure allows for the decrease of the manufacturing costs and simultaneously thickness and bezel size thereof with the reduction in total number of components and processing steps by combining the distinct components of a heat sink plate of aluminum (Al) material, a guide holder of PC material, and a core plate of synthetic metal material including magnesium (Mg), as in the comparative example, into a single component of a guide holder made of aluminum material, incorporating both heat dissipation functionality and coupling structure.

Furthermore, in the present disclosure, by eliminating or minimizing the screw fastenings according to the comparative example and changing it to a snap-fit mechanism, it is possible to prevent component deformation caused by excessive screw tightening.

The above description merely illustrates specific embodiments of the display apparatus of the present disclosure.

Therefore, it should be noted that those skilled in the art can readily understand that the present invention can be substituted or modified in various forms within the scope of the claims below, without departing from the spirit of the invention.

DESCRIPTION OF REFERENCE NUMERALS

100: display apparatus
101: front cover member
103: adhesive tape
150: display panel
160: guide holder
161: board support block
170: source printed circuit board

171: first connector
175: first flexible circuit board
180: controlled printed circuit board
181: second connector
185: second flexible circuit board
190: back cover member
191: bottom surface of the back cover member 190
192: side of the back cover member 190
200: holder member
210: first snap-fit member
211: first body
213: first protrusion
220: second snap-fit member
221: second body
223: second protrusion
230: conductive member
250: protrusion member
260: fixing member
261: fixing body
263: snap-fit groove
270: support beam
280: detachment portion
281: body beam
283: detachment protrusion
290: edge coupling portion
291: edge groove
293: edge protrusion portion
300: side adhesive member

What is claimed is:

1. A display apparatus comprising:
- a display panel;
- a front cover member positioned on a front side of the display panel;
- a guide holder positioned on a rear side of the display panel, and accommodating a source printed circuit board connected to the display panel;
- a control printed circuit board positioned on a board supporting block formed in the guide holder, and connected to the source printed circuit board;
- a back cover member positioned on a rear side of the guide holder, and enclosing the source printed circuit board and the control printed circuit board; and
- a holder member positioned on the guide holder and the back cover member, and coupling the guide holder and the back cover member.

2. The display apparatus of claim 1, wherein the holder member comprises:
- a first snap-fit member arranged on the guide holder; and
- a fixing member arranged on a bottom surface of the back cover member, and coupled with the first snap-fit member.

3. The display apparatus of claim 2, wherein the first snap-fit member comprises:
- a first body arranged to protrude in a direction of the back cover member from a bottom surface of the guide holder; and
- a first protrusion formed on the first body to protrude in a direction parallel to the guide holder.

4. The display apparatus of claim 3, wherein the fixing member comprises:
- a fixing body arranged to protrude in a direction of the guide holder from the bottom surface of the back cover member; and
- a snap-fit groove formed by penetrating the fixing body to accommodate an insertion of the first protrusion.

5. The display apparatus of claim 2, wherein the holder member further comprises:

- a second snap-fit member including a second body arranged at an edge of the guide holder and protruding in the direction of the back cover member, and a second holder formed on the second body and protruding in the direction parallel to the guide holder; and
- a protrusion member arranged to protrude inward from a side of the back cover member and engage with a second protrusion.

6. The display apparatus of claim 1, wherein the holder member further comprises:
- a support beam arranged on a bottom surface of the back cover member and formed to protrude in a direction of the control printed circuit board,
- the support beam contacting the control printed circuit board to fix the control printed circuit board in response to the guide holder being coupling with the back cover member.

7. The display apparatus of claim 6, wherein the holder member further comprises:
- a conductive member arranged on the control printed circuit board to contact the support beam and transferring heat of the control printed circuit board to the back cover member.

8. The display apparatus of claim 1, wherein the holder member comprises:
- a first snap-fit member arranged on the guide holder; and
- a detachment member arranged on a bottom surface of the back cover member to be engaged with the first snap-fit member.

9. The display apparatus of claim 8, wherein the first snap-fit member comprises:
- a first body arranged to protrude in a direction of the back cover member from a bottom surface of the guide holder, and
- a first protrusion formed on the first body to protrude in a direction parallel to the guide holder, and wherein the detachment member comprises:
- a body beam arranged to protrude in a direction of the guide holder from the bottom surface of the back cover member, and
- a detachment protrusion formed to protrude from the body beam to engage with the first protrusion.

10. The display apparatus of claim 1, wherein the holder member further comprises:
- an edge coupling portion to connect edges of the guide holder and the back cover member.

11. The display apparatus of claim 10, wherein the edge coupling portion comprises:
- an edge protrusion portion arranged to protrude at an outer edge of the guide holder; and
- an edge groove formed to be recessed into a side of the back cover member to accommodate the edge protrusion portion.

12. The display apparatus of claim 1, further comprising:
- a side adhesive member arranged along edges of the front cover member and the back cover member to adhere the front cover member and the back cover member together.

13. The display apparatus of claim 1, further comprising:
- a black coating member positioned between the guide holder and the display panel.

14. The display apparatus of claim 1, wherein the source printed circuit board is connected to the display panel via a first flexible circuit board, and wherein the control printed circuit board is connected to the source printed circuit board via a second flexible circuit board.

* * * * *